US008135558B2

(12) United States Patent
Kampf et al.

(10) Patent No.: US 8,135,558 B2
(45) Date of Patent: *Mar. 13, 2012

(54) AUTOMATED SIMULATION TESTBENCH GENERATION FOR SERIALIZER/DESERIALIZER DATAPATH SYSTEMS

(75) Inventors: Francis A. Kampf, Jeffersonville, VT (US); Jeanne Trinko-Mechler, Essex Junction, VT (US); David R. Stauffer, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 183 days.

This patent is subject to a terminal disclaimer.

(21) Appl. No.: 12/169,668

(22) Filed: Jul. 9, 2008

(65) Prior Publication Data

US 2008/0270065 A1 Oct. 30, 2008

Related U.S. Application Data (63) Continuation of application No. 11/275,035, filed on Dec. 5, 2005, now Pat. No. 7,444,258.

(51) Int. Cl.
*G06F 11/00* (2006.01)
*G06F 19/00* (2006.01)

(52) U.S. Cl. ...... 702/123; 73/865.8; 73/865.9; 324/537; 324/762.01; 324/762.06; 375/224; 702/108; 702/119; 702/182; 702/183; 702/186; 703/21

(58) Field of Classification Search ............... 702/58, 702/117–120, 122, 182, 186, 1, 57, 108, 702/123, 127, 183; 703/1, 4, 14–15, 3, 13, 703/21; 716/4, 5, 10; 709/232, 235, 237, 709/230; 370/231, 248, 229, 230, 241, 242; 73/432.1, 865.8, 865.9; 324/500, 512, 527, 324/537, 750.01, 762.01, 762.02, 762.06; 375/224; 714/1, 25, 32, 40, 43, 47.1, 100

See application file for complete search history.

(56) References Cited

U.S. PATENT DOCUMENTS

| 3,082,374 | A  | * | 3/1963  | Buuck ........................ 324/73.1 |
| 4,276,594 | A  |   | 6/1981  | Morley |
| 5,732,247 | A  | * | 3/1998  | Dearth et al. ................... 703/13 |
| 6,233,182 | B1 |   | 5/2001  | Satou et al. |
| 6,421,322 | B1 |   | 7/2002  | Koziy et al. |
| 6,425,109 | B1 |   | 7/2002  | Choukalos et al. |
| 6,640,272 | B1 |   | 10/2003 | Hartwell et al. |
| 6,678,645 | B1 |   | 1/2004  | Rajsuman et al. |
| 6,857,110 | B1 |   | 2/2005  | Rupp et al. |
| 7,290,238 | B2 |   | 10/2007 | Stauffer et al. |
| 7,444,258 | B2 | * | 10/2008 | Kampf et al. ................. 702/119 |
| 2004/0128641 | A1 |   | 7/2004  | Broberg, III et al. |
| 2004/0254779 | A1 |   | 12/2004 | Wang et al. |
| 2007/0129920 | A1 | * | 6/2007  | Kampf et al. ................... 703/13 |

* cited by examiner

*Primary Examiner* — Edward Cosimano
(74) *Attorney, Agent, or Firm* — Gibb I.P. Law Firm, LLC; Richard M. Kotulak, Esq.

(57) ABSTRACT

Embodiments herein present a method for automated simulation testbench generation for serializer/deserializer datapath systems. The method provides a database of transactors for generating and checking data within the datapath system, wherein the transactors are adaptable to arbitrary configurations of the datapath system. The database is provided with a single set of transactors per core. Next, the method automatically selects one set of transactors from the database for inclusion into the simulation testbenches. Following this, the method maps the first datapath and the second datapath through the datapath system by interconnecting the selected set of the transactors with the datapath system. The method further comprises setting control pins on the cores to facilitate propagation of the data through the cores of the datapath system. Subsequently, the control pins are traced to input ports and control registers.

16 Claims, 4 Drawing Sheets

Figure 1

(a) System A with 1 stages
Figure 2(a)

(b) System B with 2 stages
Figure 2(b)

(c) System C with 3 stages
Figure 2(c)

(d) System D with Stages 2 & 3 only
Figure 2(d)

AUTOMATED SIMULATION TESTBENCH GENERATION FOR SERIALIZER/DESERIALIZER DATAPATH SYSTEMS

CROSS-REFERENCE TO RELATED APPLICATIONS

This application is a continuation of U.S. application Ser. No. 11/275,035 filed Dec. 5, 2005, now U.S. Pat. No. 7,444,258.

BACKGROUND OF THE INVENTION

1. Field of the Invention

Embodiments herein present a method for automated simulation testbench generation for serializer/deserializer datapath systems.

2. Description of the Related Art

High speed serializer/deserializer (HSS) cores are an important part of application-specific integrated circuit (ASIC) product offering. These cores are used in conjunction with other ASIC cores to implement protocols such as XAUI, PCI Express, Serial ATA, FibreChannel, Infiniband, etc. However, the number of signal pins associated with these cores, as well as the functional complexity associated with these cores, continues to present a challenge to chip designers who must instantiate these HSS cores and associated protocol cores and connect all of the signals. Such issues were partially addressed by the invention described in U.S. patent application Ser. No. 10/709,528, now U.S. Pat. No. 7,290,238 (incorporated herein by reference), which described a means of developing a set of inference rules to facilitate automated wiring of an HSS subsystem. Having generated such a subsystem in an automated fashion, it is also desirable to generate a simulation testbench capable of verifying the connections of the subsystem.

SUMMARY OF THE INVENTION

Embodiments herein present a method for automated simulation testbench generation for serializer/deserializer datapath systems. The method generates simulation testbenches for verifying the connections between cores of a datapath system by providing a database of transactors that are adaptable to arbitrary configurations of the datapath system. The transactors are for generating and checking data within the datapath system and comprise a first transactor, a second transactor, a third transactor and a fourth transactor.

More specifically, the method comprises providing the first transactor for generating raw data on an input side of a first datapath, wherein the first datapath is an egress datapath flowing from inboard inputs of the system to outboard outputs of the system; and providing the second transactor for checking encoded data on an output side of the first datapath. Inboard signals are datapath logic signal interconnections to/from the uppermost protocol layer in the target system from/to other logic on the chip. Outboard signals are datapath logic signal interconnections to/from the lowermost layer in the target system. Moreover, the method comprises providing the third transactor for generating encoded data on an input side of a second datapath, wherein the second datapath is an ingress datapath flowing from outboard inputs of the system to inboard outputs of the system; and providing the fourth transactor for checking raw data on an output side of the second datapath. The database is provided with a single set of transactors per core. Next, given that a subsystem may contain more than one type of ASIC core, the method automatically selects one set of transactors from the database corresponding to one of the types of cores in the subsystem for inclusion into the simulation testbenches.

Following this, the method maps the first datapath and the second datapath through the datapath system by interconnecting the selected set of the transactors with the datapath system. The mapping comprises mapping the first datapath and the second datapath independently of the data to be generated and checked by the transactors. In addition, the mapping comprises mapping the first datapath and the second datapath with spatial coordinates, which maps the data from inboard datapath pins of the cores to outboard datapath pins of the cores. The first datapath and the second datapath are also mapped with temporal coordinates, which maps the data into one of several clock cycles of the first datapath and the second datapath.

The method further comprises setting control pins on the cores to facilitate propagation of the data through the cores of the datapath system. This comprises identifying control signals and control values to be asserted in the simulation testbenches.

Subsequently, the control pins are traced to an input port or a control register.

Accordingly, embodiments of the invention provide a method for generating simulation testbenches for various system configurations given a database containing one set of testbench transactors per supported core (rather than per supported system configuration). By requiring a set of transactors per core rather than per configuration, this reduces the problem of writing testbench transactors from an order $N^2$ problem to an order N problem. This is facilitated by mapping the datapath from one pipeline stage through subsequent pipeline stages to primary input/output ports of the system.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the invention.

Embodiments of the invention describe a means of developing a system of generic transactors and inference rules such that simulation testbenches may be automatically generated, as well as algorithms to solve specific challenges associated with this generation. Embodiments of the invention relate generically to bit-sliced datapath systems consisting of a set of ASIC Macros (also referred to herein as "cores") interconnected into a series of bit-sliced pipeline stages of arbitrary datapath width. Such systems may include multiple serial i/o channels, clock domain crossing FIFO macros, and protocol logic macros. In general, such a subsystem may contain a collection of n pipeline stages, where each of the n pipeline stages is Cn channels wide. Each of the Cn channels of stage n generically has an input data width of $wn_{in}$ and an output data width of $wn_{out}$, and performs $wn_{in}$:$wn_{out}$ multiplexing or demultiplexing of the datapath. The overall datapath width at the input of the stage is $Wn_{in}$=Cn×$wn_{in}$ and the overall datapath width at the output of the stage is $Wn_{out}$=Cn×$wn_{out}$. Note the constraint that the number of channels on the output of a stage $Cn_{out}$, and the corresponding datapath width at the output of a stage $Wn_{out}$ is always equal to the number of channels on the input of the next stage $C(n+1)_{in}$, and the corresponding datapath width at the input of the next stage $W(n+1)_{in}$. However, also note that generic application of embodiments of the invention requires the following characteristics of the target system remain unrestricted:

First, the order of the interconnection of channels from one pipeline stage to the next cannot be assumed and is determined by the algorithms of embodiments of the invention. An example of a reason why the channel ordering may vary is so that the target configuration achieves a bit ordering on the pins of the chip package that simplifies layout of interconnections to other chips on the circuit board.

Second, although the number of input and output channels of a given pipeline stage ($Cn_{in}$ and $Cn_{out}$) is generally equal, this is not universally true since the core for a protocol layer may add additional control/status channels. Such channels are dependent on the protocol specification and may exist for lower layers of the protocol but not for higher layers of the protocol.

Since many protocols use encoding schemes to ensure data transitions on the serial data signals (examples of which include 8b10b and 64b66b encoding), it cannot be assumed that the input and output data width of a channel ($wn_{in}$ and $wn_{out}$) are related by a power of 2.

Figure 1:
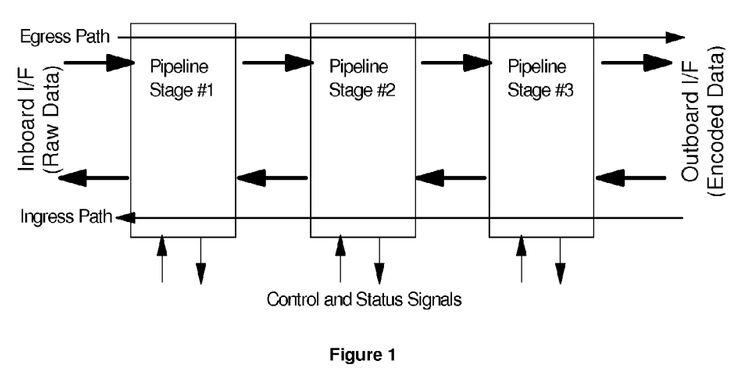
FIG. 1 illustrates a general diagram of a datapath system.
Figure 2A:
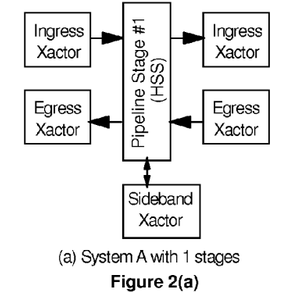
FIG. 2(a) illustrates an example configuration for a datapath system, showing one stage.
Figure 2B:
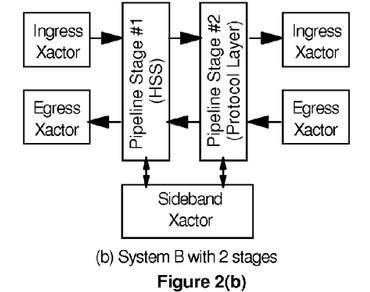
FIG. 2(b) illustrates another example configuration for a datapath system, showing two stages.
Figure 2C:
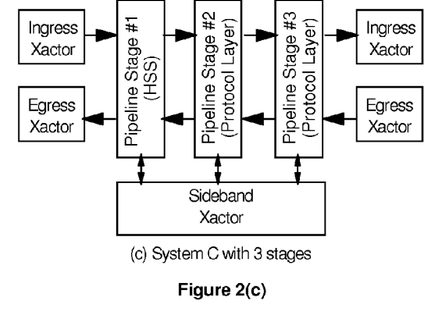
FIG. 2(c) illustrates another example configuration for a datapath system, showing three stages.
Figure 2D:
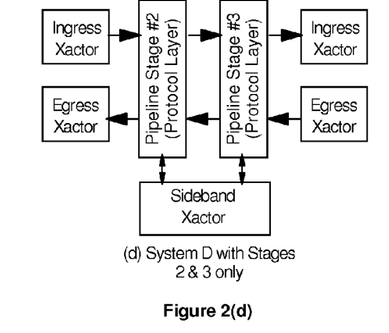
FIG. 2(d) illustrates another example configuration for a datapath system, showing two stages.

A high-level diagram of an example of such a system consisting of n=3 pipeline stages is shown in FIG. 1. This diagram illustrates datapaths propagating through the pipeline stages, and notes that pipeline stages generally include control and/or status signals used to configure the system. As illustrated in FIG. 1, the following terminology applies:

Inboard signals are datapath logic signal interconnections of the uppermost protocol layer in the target system to/from other logic on the chip. Outboard signals are datapath logic signal interconnections of the lowermost layer in the target system. Generally these signals are serial data signals connecting to/from chip i/o. However, embodiments of the invention do not rule out the possibility of the lowermost layer of the target system connecting to additional on-chip pipeline stages which were not included in the automated generation of the target system.

Raw data is the unencoded data on the inboard datapath connection to the target system. Encoded data is the data that is encoded on the outboard datapath connection to the target system. Encoding is dependent on the protocol implemented by the target system, and may consist of embedding the data within a protocol (packet protocol, Sonet protocol, etc.), and/or may include altering the data bits using an encoding scheme (such as 8b10b coding, scrambling, etc.).

The egress datapath is the datapath through the pipeline stages of the target system which flows from inboard signals to outboard signals. The ingress datapath is the datapath through the pipeline stages of the target system which flows from outboard signals to inboard signals. Datapath systems generally include both an egress and an ingress datapath, however this is not universally true.

Given a means of automated generation and wiring of a datapath system as was described in U.S. patent application Ser. No. 10/709,528, now U.S. Pat. No. 7,290,238, many arbitrarily system configurations may result. Examples are shown in FIGS. 2(*a*)-2(*d*). The datapath system which is generated may consist of just one stage of HSS cores, as shown in FIG. 2(*a*), or may consist of HSS cores plus one or more layers of protocol cores as shown in FIGS. 2(*b*) and 2(*c*). Also, embodiments of the invention allow for datapath systems which may include just protocol layers and exclude the HSS cores, as shown in FIG. 2(*d*). In addition, alternate choices are available for each of the pipeline stages in terms of the protocol being implemented, the multiplexor/demultiplexor ratios selected, and the order of interconnection between stages.

The general approach for simulation of such subsystems is to develop transactors for each interface of interest. This includes:

a transactor to drive data to the inboard interface to the uppermost protocol layer of the egress datapath;

a transactor to check encoded serial data for the outboard output of the egress datapath;

a transactor to drive encoded serial data to the outboard input of the ingress datapath;

a transactor to check the inboard data output of the uppermost protocol layer of the ingress datapath; and a sideband transactor which sets values for various control signals to the various pipeline stages of the system in order to precondition the datapath for the simulation. (Such precondition may include asserting values to various input ports of the system, and/or may include writing control registers within the system.)

Assuming the ASIC cores within the system configuration have been verified prior to release, the requirements for simulation test cases are limited to testing the interconnections between the cores. Given all of the options, however, the transactors described above are generally written uniquely for the system configuration being tested. Writing a set of transactors for each supported system configuration, and selecting from these transactors based on the system configuration, would be one trivial approach (albeit an expensive approach) for solving the problem of providing testbenches for the generated datapath subsystems. It is desirable to find a more cost-efficient means of writing a set of transactors that can then be extended to cover a range of system configurations through automated means.

Thus, embodiments of the invention describe a cost-efficient means of writing such a set of transactors and extending these for arbitrary system configurations with the goal of providing connectivity testing of arbitrary system configurations.

Embodiments of the invention may be part of a software system as described in U.S. patent application Ser. No. 10/709,528, now U.S. Pat. No. 7,290,238, which facilitates automatic generation of a subsystem netlist for a datapath system. Embodiments of the invention build a simulation testbench and stimulus/expect vectors for the subsystem so as to test connectivity of the subsystem. Such a software implementation of embodiments of the invention would additionally have to provide the following functionality: an internal database representation of the cores, pins, and nets comprising the design of the subsystem; signal tracing functionality through the database; a database of attributes and transactors associated with the cores used in the subsystem; and output writer routines capable of writing testbench VHDL or Verilog files, and stimulus/expect files.

Accordingly, embodiments of the invention provides a method for generating simulation testbenches for various system configurations given a database containing one set of testbench transactors per supported core (rather than per supported system configuration). By requiring a set of transactors per core rather than per configuration, this reduces the problem of writing testbench transactors from an order $N^2$ problem to an order N problem. This is facilitated by mapping the datapath from one pipeline stage through subsequent pipeline stages to primary input/output ports of the system.

Figure 3:
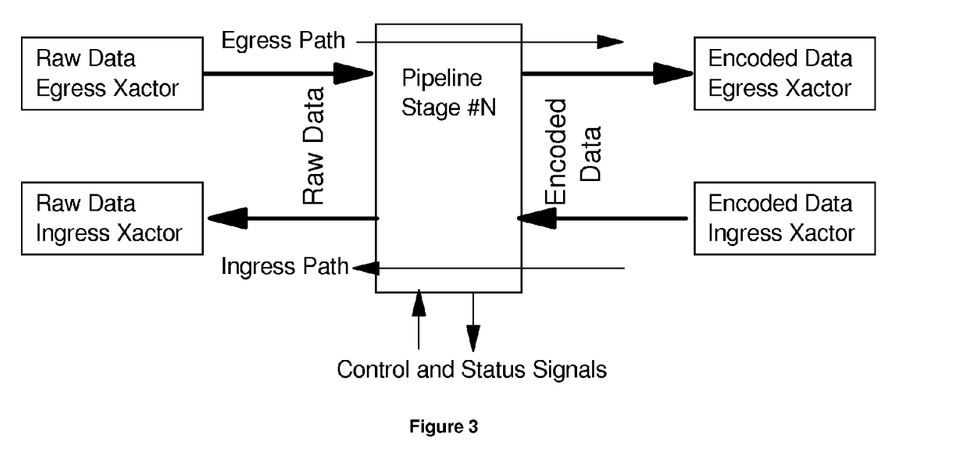
FIG. 3 illustrates transactors associated with a method of the invention.

In order to facilitate generation of a simulation testbench, there are a set of datapath transactors for each type of core which may be used to implement a pipeline stage of the datapath system. As illustrated in FIG. 3, given a Pipeline Stage #N which is implemented by cores of a given type, there is a set of datapath transactors associated with this set of cores. For example, there would be one set of transactors associated with HSS cores, another set for XAUI protocol cores, another set associated with PCI Express PHY layer cores, another set associated with PCI Express Protocol stack cores, etc. This set of transactors includes four distinct transactors as shown in FIG. 3: a raw data egress transactor (also referred herein as "REX" or "first transactor"); an encoded data egress transactor (also referred herein as "EEX" or "second transactor"); an encoded data ingress transactor (also referred herein as "EIX" or "third transactor"); and a raw data ingress transactor (also referred herein as "RIX" or "fourth transactor").

More specifically, the raw data egress transactor generates raw data into the inboard egress datapath input of the core; and the encoded data egress transactor checks encoded data on the outboard egress datapath output of the core. Furthermore, the encoded data ingress transactor generates encoded data into the outboard ingress datapath input of the core; and the raw data ingress transactor checks raw data on the inboard ingress datapath output of the core.

If the target system configuration were to include only Pipeline Stage #N then the problem to be solved would degenerate into a trivial case, and any such set of transactors would be sufficient to verify the target datapath system. However, in order to support extensibility of these transactors to generate/check system data given intervening pipeline stages, additional requirements are defined to guide construction of these transactors. When transactors designed to these requirements are combined with other algorithms of embodiments of the invention, these transactors may be used in any system containing the corresponding core type, even if additional pipeline stages including lower layers of protocol are included in the system. In the following, references to the "target core" indicate the core for which the transactor set was written; and references to "target system" refer to a system containing the target core and arbitrary additional pipeline stages.

As discussed above, the raw data egress transactor (REX) generates raw data on the inboard side of the egress datapath. This transactor includes: generating data and handshake logic. More specifically, this transactor generates raw data based on an embedded algorithm or embedded stimulus. A pseudo-random pattern generator would be an example of an embedded algorithm that could be used to generate data. Also, if there are protocol requirements that are expected by the target core to have been inserted at a higher protocol layer, then the generation algorithm produces stimulus that is consistent with these requirements. Furthermore, the generation algorithm includes a training pattern which will be recognizable to the encoded data egress transactor (EEX), and is sent for a sufficiently long period at the beginning of the simulation such that the EEX transactor will recognize this pattern after the target system finishes initialization. Alternatively, the training pattern may be sent at regular intervals throughout the simulation with the expectation that the EEX transactor will recognize the first occurrence of this pattern once the target system finishes initialization.

With regards to handshake logic, if the inboard egress datapath interface into the target core requires exchange of handshake signals with a higher layer of processing, then this handshake is be implemented by the REX transactor in a valid manner.

There is a one-to-one mapping of ports on the REX transactor to pins on the inboard egress datapath interface into the target core. Tracing algorithms will trace these pins of the core to input/output ports of the system, and the simulation testbench is built by connecting these ports to the corresponding ports on the transactor instantiation.

Figure 4:
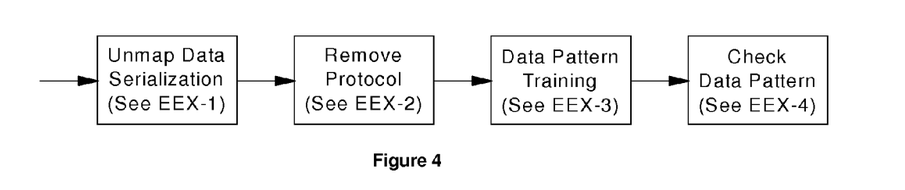
FIG. 4 illustrates a data flow a transactor associated with a method of the invention.

As described above, the encoded data egress transactor (EEX) checks that the encoded data on the outboard egress datapath output of the target core corresponds to the expected raw data generated by the REX transactor. The data flow for this transactor as used by embodiments of the invention is shown in FIG. 4. Implementation of this flow is provided in order to allow for intervening pipeline stages in the target system configuration. These transactor data flow stages comprise unmapping serial data, removing protocol, data pattern training, and data pattern checking.

For unmapping serial data, the outboard egress datapath of the target system is connected to the data input of this transactor. The transactor unmaps the serialized data in a parameterized fashion such that it is scalable to the data width of the encoded data. This scalability accounts for any serialization of data that may have occurred due to intervening pipeline stages which may or may not be present in the target system. The following describes the implementation of this requirement in embodiments of the invention:

Assuming the following parameters are supplied to the transactor:

---
Win = the width of the datapath for the target system
cumulative_cycles = the cumulative cycles associated
with the datapath for the target system (defined later in this disclosure)
Wcore = Win × cumulate_cycles

---

Each pin on the egress datapath output of the target core will have an associated mapping position which is specific to the target system. Generation of this mapping is described more fully below. The mapping position is two-dimensional, with both spatial and temporal coordinates. The input to the transactor reverses this mapping using the following algorithm, where the egress_data_input comes from the outboard system output ports for the egress data path, and the demultiplexed_data register contains the reverse-mapped data used by the next EEX transactor stage:

---
/* Algorithm for unmapping the egress data */
---
```
input [ Win – 1 : 0 ] egress_data_input;
reg [0 : cumulative_cycles – 1 ] egress_data [ Win – 1 : 0 ];
reg [ Wcore – 1 : 0 ] demultiplexed_data;
reg [0 : cumulative_cycles – 1 ] position_time_pair [ Win – 1 : 0 ]
   members p, t;
always @(posedge bit_rate_clock or reset_capture) begin
   if (reset_capture == '1') then
      cycle_count = 0;
   else
      egress_data[ cycle_count ] = egress_data_input;
      cycle_count = (cycle_count + 1) modulo cumulative_cycles;
   end if;
end always;
always @(posedge xactor_clock) begin
   for i = 0 to ( Win – 1 ) begin
      for j = 0 to ( cumulative_cycles – 1 ) begin
         k = position_time_pair.p [ j ] [ i ] – 1;
         demultiplexed_data[ k ] = egress_data[ j ] [ i ];
      end for;
   end for;
   pulse reset_capture;
end always;
```
---

After data is unmapped to reverse any serialization, the EEX transactor removes any protocol encoding that was inserted by the target core. This includes decoding any encoding schemes such as 8b10b code, 64b66b code, scrambling, etc. It also includes removing protocol overhead such as packet headers, trailers, idles, skips, etc. that was inserted by the target core. The output of this stage of the EEX transactor is equivalent to the inboard raw data input to the target core. Implementation of this transactor stage is application-specific based on the design of the target core.

The protocol overhead and encoding are checked only to the extent required to satisfy the goal of connectivity testing of the system. Connectivity test of the datapath is primarily accomplished by the subsequent comparison of the raw data stream to expected data. Otherwise, protocol overhead is simply discarded by this stage.

With regards to data pattern training, in order to ensure operation independent of the latency of the target system, a training stage is included in the EEX transactor. This stage searches the data for a recognizable data pattern that is sent repeatedly by the REX transactor. The algorithm for this stage is as follows for embodiments of the invention:

---
/* Algorithm for Data Training */
---
```
input [ Wcore – 1 : 0 ] raw_data;
constant training_depth = { length of training pattern };
constant [ training_depth – 1 : 0 ] training_data [ Wcore – 1 : 0 ] =
   {expected training pattern};
reg training_state = 0
reg training_complete = not_complete;
always @(posedge xactor_clock) begin
   if ( training_complete == not_complete ) then
      if ( raw_data == training_data[training_state] ) then
         training_state = training_state + 1;
      else
         if ( raw_data == training_data[0] ) then
            training_state = 1;
         else
            training_state = 0;
         end if;
      end if;
      if ( training_state == training_depth ) then
         training_complete = complete;
      end if;
   end if;
end always;
```
---

The algorithm allows for an arbitrary depth for the expected training pattern, thereby allowing for incoming data to be searched for a sufficiently long pattern to ensure aliasing does not occur.

For checking data pattern, the raw data is checked to determine whether it matches the expected data. Expected data is determined in a similar manner as was used to generate stimulus data by the REX transactor. Data is only checked once the previous stage has set the training_complete flag.

Figure 5:
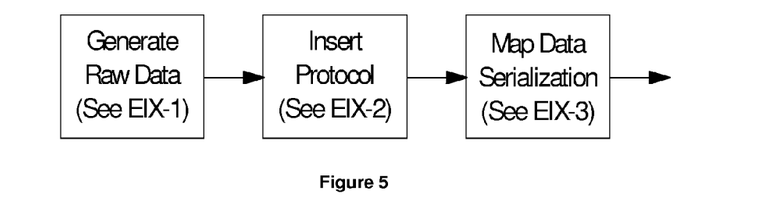
FIG. 5 illustrates a data flow another transactor associated with a method of the invention.

As discussed above, the encoded data ingress transactor (EIX) generates encoded data on the outboard side of the ingress datapath input of the target core. The data flow for this transactor as used by embodiments of the invention is shown in FIG. 5. Implementation of this flow is provided in order to allow for intervening pipeline stages in the target system configuration. These transactor data flow stages comprise generating data, inserting protocol, and mapping serial data.

First, the EIX transactor generates raw data based on an embedded algorithm or embedded stimulus. A pseudo-random pattern generator would be an example of an embedded algorithm that could be used to generate data. Also, the generation algorithm includes a training pattern which will be recognizable to the raw data ingress transactor (RIX), and is sent for a sufficiently long period at the beginning of the simulation such that the RIX transactor will recognize this pattern after the target system finishes initialization. Alternatively, the training pattern may be sent at regular intervals throughout the simulation with the expectation that the RIX transactor will recognize the first occurrence of this pattern once the target system finishes initialization.

Second, the EIX transactor implements a sufficient level of protocol such that the target core will be able to receive the ingress data without errors. This includes encoding data with 8b10b code, 64b66b code, scrambling, etc., if applicable. It also includes adding protocol overhead such as packet headers, trailers, idles, skips, etc. that are expected by the target core. Implementation of this transactor stage is application-specific based on the design of the target core.

Third, the data output of the EIX transactor is connected to the outboard ingress datapath of the target system. The transactor maps the serialized data in a parameterized fashion such that it is scalable to the data width of the encoded data. This scalability accounts for any deserialization of data that may occur due to intervening pipeline stages which may or may not be present in the target system. The following describes the implementation of this requirement in embodiments of the invention:

Assuming the following parameters are supplied to the transactor:

---
Win = the width of the datapath for the target system
cumulative_cycles = the cumulative cycles associated with the datapath for the target system (defined later in this disclosure)
Wcore = Win × cumulate_cycles

---

Each pin on the ingress datapath input of the target core will have an associated mapping position which is specific to the target system. Generation of this mapping is described below. The mapping position is two-dimensional, with both spatial and temporal coordinates. The output of the transactor implements this mapping using the following algorithm, where the demultiplexed_data register contains unmapped data from the previous stage of the EIX transactor, and the ingress_data_output is connected to the system input ports for the outboard ports of the ingress data path:

---
/* Algorithm for mapping the ingress data */
---
```
output [ Win - 1 : 0 ] ingress_data_output;
reg [0 : cumulative_cycles - 1 ] ingress_data [ Win - 1 : 0 ];
reg [ Wcore - 1 : 0 ] demultiplexed_data;
reg [0 : cumulative_cycles - 1 ] position_time_pair [ Win - 1 : 0 ]
    members p, t;
always @(posedge xactor_clock) begin
    for i = 0 to ( Win - 1 ) begin
        for j = 0 to ( cumulative_cycles - 1 ) begin
            k = position_time_pair.p [ j ] [ i ] - 1;
            ingress_data[ j ] [ i ] = demultiplexed_data[ k ];
        end for;
    end for;
    pulse reset_launch;
end always;
always @(posedge bit_rate_clock or reset_launch) begin
    if (reset_launch == '1') then
        cycle_count = 0;
    else
        ingress_data_output = ingress_data[ cycle_count ];
        cycle_count = (cycle_count + 1) modulo SFin;
    end if;
end always;
```
---

Figure 6:
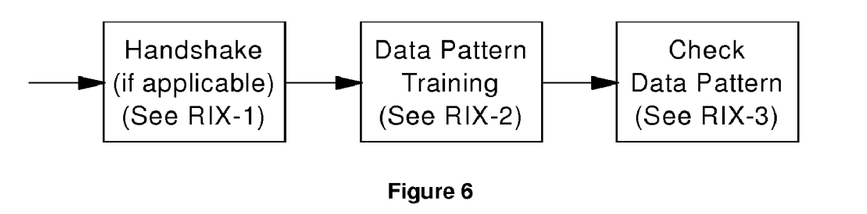
FIG. 6 illustrates a data flow another transactor associated with a method of the invention.

As described above, the raw data ingress transactor (RIX) checks raw data on the inboard side of the ingress datapath. The data flow for this transactor as used by the preferred embodiment of this invention is shown in FIG. 6.

There is a one-to-one mapping of ports on the RIX transactor to pins on the inboard ingress datapath interface into the target core. Tracing algorithms will trace these pins of the core to input/output ports of the system, and the simulation testbench is built by connecting these ports to the corresponding ports on the transactor instantiation. Data flow stages of the RIX transactor include: handshake logic, data pattern training, and data pattern checking.

First, if the inboard ingress datapath interface from the target core requires exchange of handshake signals with a higher layer of processing, then this handshake is implemented by the RIX transactor in a valid manner.

Second, in order to ensure operation independent of the latency of the target system, a training stage is provided in the RIX transactor. This stage searches the data for a recognizable data pattern that is sent repeatedly by the EIX transactor. The algorithm for this stage is as follows for embodiments of the invention:

---
/* Algorithm for Data Training */
---
```
input [ Wcore - 1 : 0 ] raw_data;
constant training_depth = { length of training pattern };
constant [ training_depth - 1 : 0 ] training_data [ Wcore - 1 : 0 ] =
    {expected training pattern};
reg training_state = 0;
reg training_complete = not_complete;
always @(posedge xactor_clock) begin
    if ( training_complete == not_complete ) then
        if ( raw_data == training_data[training_state] ) then
            training_state = training_state + 1;
        else
            if ( raw_data == training_data[0] ) then
                training_state = 1;
            else
                training_state = 0;
            end if;
        end if;
        if ( training_state == training_depth ) then
            training_complete = complete;
        end if;
    end if;
end always;
```
---

The algorithm allows for an arbitrary depth for the expected training pattern, thereby allowing for incoming data to be searched for a sufficiently long pattern to ensure aliasing does not occur.

Third, the raw data is checked to determine whether it matches the expected data. Expected data is determined in a similar manner as was used to generate stimulus data by the EIX transactor. Data is only checked once the previous stage has set the training_complete flag.

The REX and RIX transactors for a given target core have a one-to-one mapping of transactor ports to pins on the egress and ingress (respectively) inboard datapath interfaces of the target core. The EEX and EIX transactors for the target core have a similar relationship to the egress and ingress (respectively) outboard datapath interfaces of the target core, but with scalability to account for serialization/deserialization of data occurring in intervening pipeline stages. If there is one instance of the target core in the pipeline stage, then there is one corresponding instance of each of the associated REX, RIX, EEX, and EIX transactors in the simulation testbench for the system.

In the event the pipeline stage consists of n instances of the target core, each implementing a bit-slice of the egress and/or ingress datapath, then the simulation testbench will contain n instances of each of the REX, RIX, EEX, and EIX transactors corresponding to the target core. Operation of each of these bit slices is independent unless provisions have been made in the transactor design to coordinate multiple bit slices. Such coordination, if it exists, is implemented as a set of ports on the transactor in embodiments of the invention. Such port connections are daisy-chained from each transactor instance to the transactor instances associated with adjacent bit-slices. Detailed definition of the functionality of this interface is dependent on the application being implemented by the target core.

The size of the bit-slice for purposes of transactor functionality is defined by the width of the bit-slice for the target core corresponding to the set of transactors being used. The algorithm for selecting which pipeline stage controls the selection of transactors is described below. This bit-slice definition is independent of the bit-slice width for any intervening pipeline stages between the pipeline stage containing the target core and the outboard interface of the target system. In general, each pipeline stage may use cores which have a dissimilar bit-slice width. The Unmap Serial Data stage of the EEX transactor and the Map Serial Data stage of the EIX transactor reconstruct correspondence of datapath signals to the target core pins regardless of the bit-slice width used by intervening pipeline stages.

As discussed above, each potential target core has an associated set of transactors which include a REX, EEX, EIX, and RIX transactor. These transactors were constructed such that: the REX and RIX transactors are assumed to connect directly to the egress and ingress (respectively) inboard interfaces of the target core; and the EEX and EIX transactors are assumed to connect to the egress and ingress (respectively) outboard interfaces of the target system, with arbitrary intervening pipeline stages between the transactors and the target core.

If the target system contains multiple pipeline stages, then the transactor database contains a set of REX, EEX, EIX, and RIX transactors for each type of core used in the system. Only one set of transactors should be selected for inclusion in the simulation testbench. As is consistent with the manner in which transactor requirements were constructed, the set of transactors corresponding to the cores used in the highest protocol layer (i.e. the most inboard pipeline stage) should be selected. The REX and RIX transactor inputs and outputs correspond directly to pins on the target cores of this pipeline stage. Connections for the EEX and EIX transactors are determined by tracing from the target core pins, through intervening pipeline stages, and to input/output ports of the target system using the remapping algorithms described below.

Although the above descriptions of transactors, including descriptions of scaling and selection, have assumed each core implements both an ingress and an egress datapath, this is not universally true. Some cores only support an egress datapath and only have an associated REX and EEX transactor; some cores only support an ingress datapath and only have an associated EIX and RIX transactor. To handle such partitioning of function, embodiments of the invention make an independent selection of transactors for the egress and ingress datapath.

As discussed above, the set of transactors corresponding to the cores used for one of the pipeline stages of the system is selected as the basis for generating the simulation testbench. One set of transactors is provided per core, rather than one set of transactors per potential system configuration. This is facilitated by mapping the datapath from one pipeline stage through subsequent pipeline stages to primary input/output ports of the system. Such mapping is determined for the specific configuration of the target system for a number of reasons. First, the order of the interconnection of channels from one pipeline stage to the next cannot be assumed and is determined by the algorithms of embodiments of the invention. Second, the presence/absence of intervening pipeline stages cannot be assumed and is determined by the algorithms of the disclosed invention. Third, since intervening pipeline stages perform serialization/deserialization of the data, algorithms of embodiments of the invention perform mapping using both spatial and temporal coordinates.

Such functionality involves certain parameters to be associated with the various cores which may be encountered in these intervening pipeline stages, and involves use of remapping algorithms, both of which are described below.

Scale Factor and Input Cycles are parameters associated with each type of core which may be used in an intervening pipeline stage. Each core has an associated Scale Factor corresponding to the scaling of stimulus vectors through the core. A Scale Factor of N indicates that for every cycle which occurs on the datapath interface on the inboard (raw data) side of the core, N cycles occur on the datapath interface on the outboard (encoded data) side of the core. Generally, N is not assumed to be constrained to be an integer. Input Cycles is the minimum value integer such that Scale Factor×Input Cycles is an integer value. If Scale Factor is an integer, then Input Cycles is equal to 1.

Pin Map and Time Index are parameters associated with each pin (input or output) of the inboard (raw data) datapath on the core. The Pin Map parameter is a pointer to a corresponding pin on the outboard (encoded data) datapath of the core. If the inboard datapath pin is an input pin, then the Pin Map parameter indicates the output pin of the outboard datapath to which the data is driven. If the inboard datapath pin is an output pin, then the Pin Map parameter indicates the input pin of the outboard datapath from which data originated. The Pin Map parameter is independent of any pipeline latency introduced into the datapath by the core.

The Time Index parameter is an integer in the range of 1 to Scale Factor indicating the temporal position of the data mapping. A given cycle on the inboard (raw data) interface to/from the core corresponds to Scale Factor cycles of the outboard (encoded data) interface. Pins with Time Index=1 are temporally associated with the first cycle on the outboard datapath; pins with Time Index=2 are associated with the second cycle, and so forth.

Figure 7:
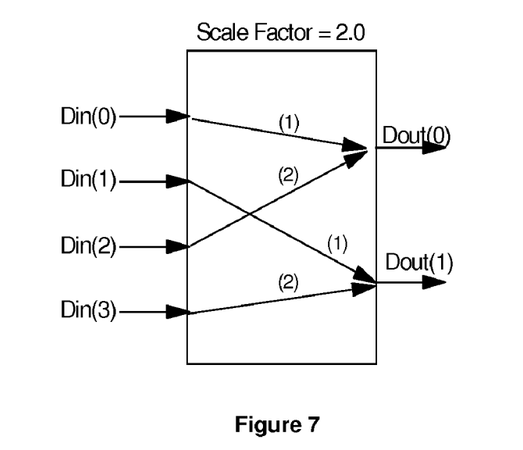
FIG. 7 illustrates remapping attributes for a 4:2 multiplexor example.

FIG. 7 illustrates these parameters for the example of a 4 input multiplexor function which bit-wise maps the inputs to 2 output pins. There are two clock cycles on the output for every clock cycle on the input of this example, and therefore the Scale Factor for this core is 2. The Pin Map attributes for Din[1:0] map to Dout[1:0] respectively, and have Time Index equal to 1, indicating that during the first of the two clock cycles, the data on Din[1:0] will map to Dout[1:0]. The Pin Map attributes for Din[3:2] similarly map to D[1:0], but with Time Index equal to 2, indicating that Din[3:2] maps to Dout[1:0] during the second of the two clock cycles.

Assuming that N cycles of data have been mapped to the Din[3:0] pins of this example (rather than just one cycle of data), if there are N cycles being considered on the inboard datapath, then this corresponds 2N cycles on the outboard datapath in this example. Generically, there are Scale Factor×N cycles on the outboard datapath for every N cycles of the inboard datapath. Given a temporal position in the range of 1 to N for each bit of data on the inboard datapath pins, the Pin Map and Time Index parameters allow these data bits to be mapped to a corresponding pin and temporal position in the range of 1 to Scale Factor×N on the outboard datapath pins.

Generically, the Scale Factor parameter of the core might not be an integer, in which case the Input Cycles parameter will be greater than 1. In this case, there will be N pairs of Pin Map and Time Index parameters associated with each pin of the inboard datapath, where N is equal to the Input Cycles parameter value.

As discussed above, embodiments of the invention utilize a remapping algorithm. Remapping starts at the outboard (encoded data) datapath pins for the pipeline stage corresponding to the highest layer of the protocol (i.e. the pipeline stage and corresponding core type controlling the transactor selection). Data on these datapath pins are represented as bit position and time slice coordinates, which are referred to as "position/time pairs".

Remapping then progresses through each pipeline stage moving from the inboard datapath to the outboard datapath of each stage. The remapping algorithm translates each position/time pair on each of the inboard datapath pins to a corresponding position/time pair on one of the outboard datapath pins. This remapping progresses, stage by stage, until primary input/output ports of the subsystem corresponding to the encoded data datapath inputs/outputs are reached. Remapping occurs from inboard to outboard datapath of each pipeline stage for both the ingress and egress datapaths. The Remapping Algorithm used to perform this remapping function is as follows:

```
/* Remapping Algorithm */
for pipeline_stage p = 2 to n begin /* from raw data to encoded data
starting at outboard datapath of first stage */
    for each inboard pin i on p begin
        for each position_time_pair j on inboard pin i begin
            new_pair.position = j.position;
            new_pair.time = 1 + ( i.time_index − 1 ) + ( (j.time − 1) ×
            p.scale_factor );
            outboard pin k = i.mapped_pin;
            add new_pair to list of position_time_pairs for outboard pin k;
        end for;
    end for;
end for; /* algorithm is executed for each of ingress and egress paths */
```

Figure 8:
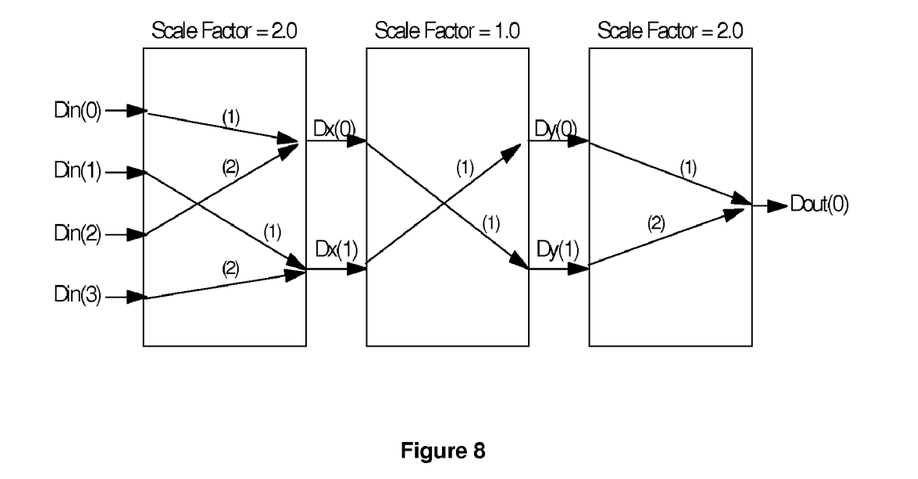
FIG. 8 illustrates a multistage remapping example.

The example shown in FIG. 8 is used to illustrate this algorithm. Assuming that initially, the Din(0:3) input pins of the leftmost stage have the following position/time pairs assigned:

$Din(0)=(p=1,t=1); Din(1)=(p=2,t=1); Din(2)=(p=3, t=1); Din(3)=(p=4,t=1).$

The position/time pairs are mapped through the first pipeline stage to the following position/time pairs on the Dx(0:1) signals:

$Dx(0)=\{(p=1,t=1)(p=3,t=2)\}; Dx(1)=\{(p=2,t=1) (p=4,t=2)\}$

In a corresponding manner, the position/time pairs on Dx(0:1) are mapped to the following position/time pairs on the Dy(0:1) signals:

$Dy(0)=\{(p=2,t=1)(p=4,t=2)\}; Dy(1)=\{(p=1,t=1) (p=3,t=2)\}$

Finally, the position/time pairs on Dy(0:1) are mapped to the following position/time pairs on the Dout(0) signal:

$Dout(0)=\{(p=2,t=1)(p=1,t=2)(p=4,t=3)(p=3,t=4)\}$

Position/time pairs are initially assigned to the outboard datapath of the first pipeline stage. Position/time pairs for a sufficient number of cycles are assigned such that the number of cycles of position/time pairs at the inboard datapath interface to each subsequent pipeline stage is evenly divisible by the Input Cycles parameter for that stage. The following algorithm searches until the appropriate number of cycles for this initial assignment is found.

```
/* Algorithm to determine number of cycles of position/time
pairs for initial assignment. */
initial_cycles = 0;
do begin
    found_flag = found? ;
    initial_cycles = initial_cycles + 1;
```

```
/* Algorithm to determine number of cycles of position/time
pairs for initial assignment. */
    cumulative_cycles = initial_cycles;
    for pipeline stage p = 2 to number_of_stages begin
        i = cumulative_cycles / p.input_cycles;
        if i is not an integer then
            found_flag = not_found;
            break out of for loop;
        end if;
        cumulative_cycles = cumulative_cycles × p.scale_factor;
    end for;
repeat while found_flag == not_found;
/* value of initial_cycles upon loop exit is used for initial position/time
pair assignment. */
```

The final value of cumulative_cycles determined by this algorithm is used by the Unmap Serial Data algorithm of the EEX transactor, and the Map Serial Data algorithm of the EIX transactor as described above.

Given the value of initial_cycles calculated by the above algorithm, position/time pairs are assigned to the outboard datapath pins of the first pipeline stage using the following algorithm:

```
/* Algorithm to perform initial assignment of position/time pairs. */
reg [ data_width − 1 : 0 ] outboard_datapath ;
/* outboard datapath pins of first stage */
for cycle t = 1 to initial_cycles begin
    for bit index j = 1 to data_width begin
        pin i = outboard_datapath [ j ] ;
        new_pair.position = ( j − 1 ) + ( data_width × ( t − 1 ) );
        new_pair.time_slice = t ;
        add new_pair to list of position_time_pairs for pin i ;
    end for;
end for;
```

After execution of these algorithms, a total of time_slice times data_width position/time pairs will have been assigned to the outboard datapath pins of the first pipeline stage. These position/time pairs are then propagated through other pipeline stages using the Remapping Algorithm described previously.

The set of position_time_pairs which is calculated by this algorithm is used to initialize the position_time_pairs registers defined in the descriptions of the Unmap Serial Data algorithm of the EEX transactor, and the Map Serial Data algorithm of the EIX transactor.

As discussed above, as part of the initialization sequence of the simulation testcase, various control pins are set on the various cores of the system such that the correct modes of operation are selected and the datapath is sensitized. However, the means by which values can be asserted on these pins is dependent on the exact system configuration. In some cases the pins will be connected to primary input ports of the system netlist, while in other cases these pins connect to control registers which are written by a transactor through a register interface. It is also possible that the pins have been tied within the netlist such that no action is required in the simulation testbench.

In order to sensitize pins appropriately, parameters are defined for the cores used in the system, and for pins on those cores, which identify the control signals and control values to be asserted in the simulation. Pin connections are traced through the netlist to determine corresponding primary input ports, control register bits, or tie values, and appropriate actions are taken.

In some cases the stimulus value to which the pin is sensitized is dependent on other cores used within the subsystem. Therefore, override parameters are required which allow the presence of a core within the system to specify the stimulus value for a control pin on another core.

Additionally, there may be control pins which require connection to transactors, but are not part of the datapath. Parameters are provided to identify such pins. Pins are traced to primary input or output ports of the system, and are connected to the appropriate ports of the corresponding transactor. If pins cannot be traced to system ports then an error has occurred.

The following parameters are defined for each core pin which includes specific stimulus values in order for simulation to function properly: first, the control_value parameter comprises logic value to which pin is tied for proper operation of the simulation. Second, the xactor_pin_map parameter comprises specification of a transactor pin to which the core pin is connected for proper operation of the simulation.

A override_spec parameter may also be attached to a core used in the system. This specifies a core cell name, pin on that core, and logic value or transactor pin map. The override specification is only applied if the core to which the override specification is attached is instantiated in the target system, and the core which is named by the override_spec is also instantiated in the target system. If both cores are present, then the logic value and/or transactor pin map specified by the override specification take precedence over any pin parameters.

Core pins for which any of the above parameters are defined are traced to control points, and the appropriate action is taken. The following actions are taken for each pin for which a control_value is specified, based on the trace results: first, if the pin connection is traced to a primary input port, then this system port is tied to the appropriate value in the simulation testbench. Second, if the pin connection is traced to a control register, then the register address, bit position, and value are provided to a register interface transactor, which will write the appropriate value to this control register at the beginning of the simulation. Third, if the pin connection is traced to a tie value, then the tie value is checked to ensure it is consistent with the requirements of the simulation. If it is not consistent, then an error is generated; otherwise no further action is required.

The following actions are taken for each pin for which a xactor_pin_map is specified, based on the trace results: if the pin connection is traced to a primary input or output port, then connect pin to specified transactor pin. If the pin connection is traced to a control register or tie value, an error is generated.

The above description generates errors if certain inconsistencies are encountered which prevent connections from being made. However, this does not represent a limitation on the algorithm. Embodiments of the invention are intended to build a simulation testbench for a target system configuration that was constructed in an automated fashion from a set of wiring inference rules (as described in U.S. patent application Ser. No. 10/709,528, now U.S. Pat. No. 7,290,238). In cases where the testbench transactors require access to certain pins on the core, or require specific tie values for pins, such restrictions would be accounted for by the wiring inference rules for these pins. Therefore selection of incompatible configurations would not be allowed by the wiring inference rules, and systems would never be generated for which a testbench could not be constructed. The error cases flagged by this algorithm therefore represent cases where wiring inference rules for the system have not been coded correctly. The actions as described above are executed by the following algorithm:

```
/* Algorithm to determine appropriate control signal actions */
reg [ 0 : address_range - 1] register_bit_map
[ reg_if_width - 1 : 0 ] = all '0';
/* Start by setting overrides */
for pipeline stage p = number_of_stages downto 1 begin
    for each override_spec defined for pipeline stage p begin
        if override_spec.cell_name exists then /* set override */
            for each instance i of override_spec.cell_name begin
                set override_spec.control_value on override_spec.pin_name
                    on i ;
                set override_spec.xactor_pin_map on
                    override_spec.pin_name on i ;
            end for;
        end if;
    end for;
end for;
/* Trace pins with control_value parameters */
for each pin j for which parameter control_value is defined begin
    control point k = trace back results from pin j ;
    if k is an input port then
        connect k to logic level specified by j.control_value in testbench;
    elseif k is a control register then
        register_bit_map[ k.register_address ] [ k.register_bit_position ] =
            j.control_value ;
    elseif k is a tie point then
        if k.tie_value != j.control_value then generate error;
    else /* all other trace results */
        generate error;
    end if;
end for;
/* Trace pins with xactor_pin_map parameters */
for each pin j for which parameter xactor_pin_map is defined begin
    control point k = trace results from pin j ;
    if k is an input or output port then
        connect k to transactor pin specified by j.xactor_pin_map
            in testbench;
    else /* all other trace results */
        generate error;
    end if;
end for;
```

Implicit in this is the assumption that a transactor is included in the simulation testbench which writes registers in the simulation testbench. This transactor writes all registers as part of the initialization sequence for the simulation testcase. The register_bit_map value resulting from the above algorithm is an input to this testbench, and is used to determine the values to be written to the registers.

Thus, embodiments herein present a method for automated simulation testbench generation for serializer/deserializer datapath systems. The method generates simulation testbenches for verifying the connections between cores of a datapath system by providing a database of transactors that are adaptable to arbitrary configurations of the datapath system. The transactors are for generating and checking data within the datapath system and comprise a first transactor (REX), a second transactor (EEX), a third transactor (EIX) and a fourth transactor (RIX).

More specifically, the method comprises providing the first transactor for generating raw data on an input side of a first datapath, wherein the first datapath is an egress datapath flowing from inboard inputs of the system to outboard outputs of the system. As discussed above, the first transactor generates raw data based on an embedded algorithm or embedded stimulus. Moreover, if the inboard egress datapath interface into the target core requires exchange of handshake signals with a higher layer of processing, then this handshake is implemented by the first transactor in a valid manner.

The second transactor is provided for checking encoded data on an output side of the first datapath. As discussed above, the data flow stages for the second transactor comprise: unmapping serial data, removing protocol, data pattern training, and checking data pattern. Next, the third transactor is provided for generating encoded data on an input side of a second datapath, wherein the second datapath is an ingress datapath flowing from outboard inputs of the system to inboard outputs of the system. Also as discussed above, the data flow stages for the third transactor comprise: generating data, inserting protocol, and mapping serial data. The fourth transactor for checking raw data on an output side of the second datapath. The data flow stages for the fourth transactor comprise: handshake logic, data pattern training, and checking data pattern.

The method provides the database with a single set of transactors per core. By requiring a set of transactors per core rather than per configuration, this reduces the problem of writing testbench transactors from an order $N^2$ problem to an order N problem. As discussed above, this is facilitated by mapping the datapath from one pipeline stage through subsequent pipeline stages to primary input/output ports of the system.

Next, the method automatically selects one set of transactors from the database for inclusion into the simulation testbenches. As discussed above, and as is consistent with the manner in which transactor requirements were constructed, the set of transactors corresponding to the cores used in the highest protocol layer (i.e. the most inboard pipeline stage) should be selected. The first transactor and fourth transactor inputs and outputs correspond directly to pins on the target cores of this pipeline stage. Connections for the second transactor and third transactor are determined by tracing from the target core pins, through intervening pipeline stages, and to input/output ports of the target system using the remapping algorithms.

Following selection of a set of transactors, the method maps the first datapath and the second datapath through the datapath system by interconnecting the selected set of transactors with the datapath system. Such mapping must be determined for the specific configuration of the target system since the order of the interconnection of channels from one pipeline stage to the next cannot be assumed and must be determined by the algorithms discussed above. Moreover, the presence/absence of intervening pipeline stages cannot be assumed and must be determined by such algorithms.

The mapping comprises mapping the first datapath and the second datapath independently of the data to be generated and checked by the transactors. In addition, the mapping comprises mapping the first datapath and the second datapath with spatial coordinates, which maps the data from inboard datapath pins of the cores to outboard datapath pins of the cores. The first datapath and the second datapath are also mapped with temporal coordinates, which maps the data into one of several clock cycles of the first datapath and the second datapath. For example, as described above, the egress_data_input comes from the outboard system output ports for the egress data path, and the demultiplexed_data register contains the reverse-mapped data used by the next EEX transactor stage. Moreover, the output of the transactor implements this mapping using the following algorithm, where the demultiplexed_data register contains unmapped data from the previous stage of the EIX transactor, and the ingress_data_output is connected to the system input ports for the outboard ports of the ingress data path.

The method further comprises setting control pins on the cores to facilitate propagation of the data through the cores of the datapath system. This comprises identifying control signals and control values to be asserted in the simulation testbenches. Next, the control pins are traced to an input port or a control register. As discussed above, various control pins are set on the various cores of the system such that the correct modes of operation are selected and the datapath is sensitized. However, the means by which values can be asserted on these pins is dependent on the exact system configuration. In some cases the pins will be connected to primary input ports of the system netlist, while in other cases these pins connect to control registers which must be written by a transactor through a register interface. It is also possible that the pins have been tied within the netlist such that no action is required in the simulation testbench.

Figure 9:
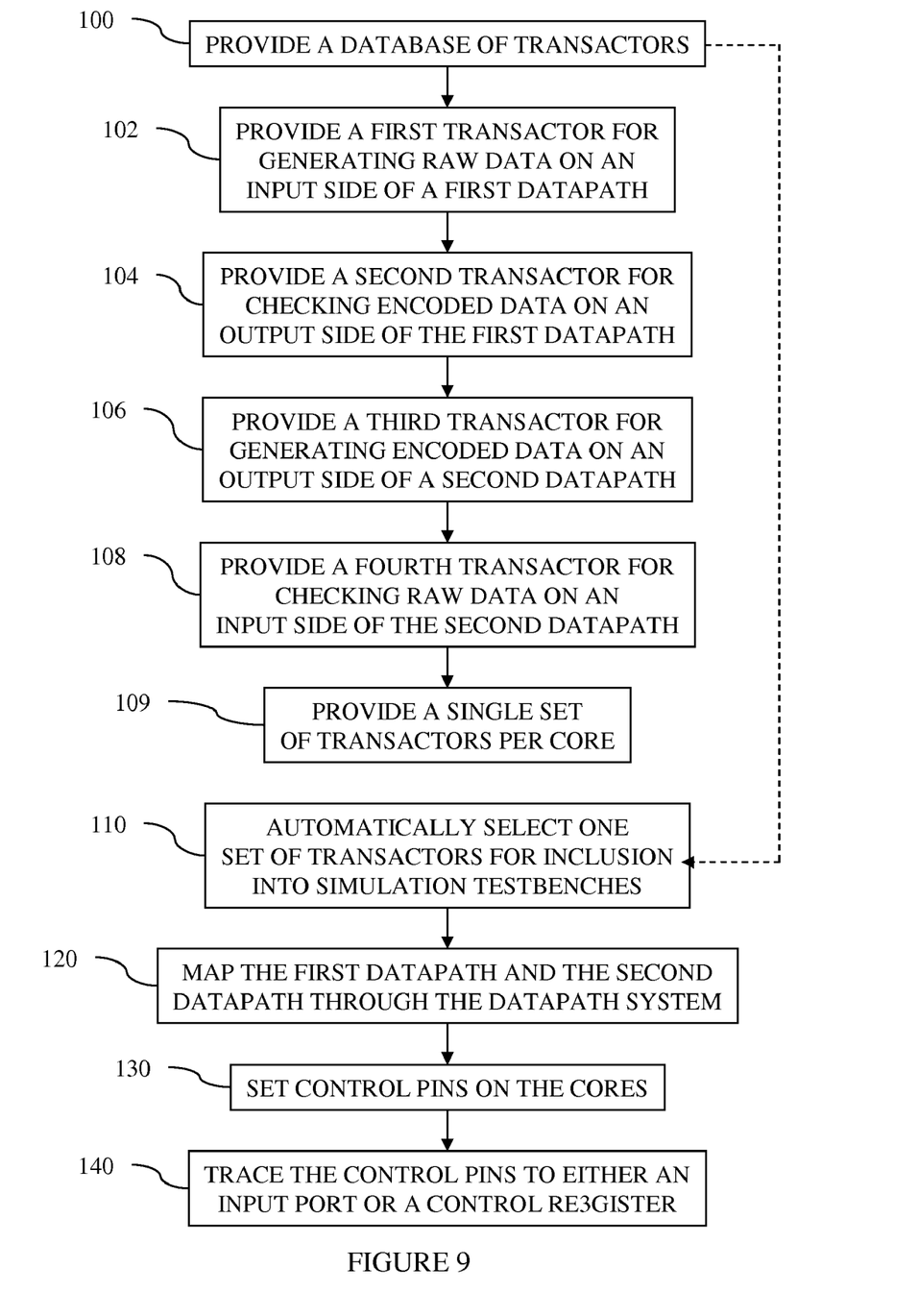
FIG. 9 is a flow diagram illustrating a method of the invention.

FIG. 9 illustrates a flow diagram of a method for automated simulation testbench generation for serializer/deserializer datapath systems. In item 100, the method begins by providing a database of transactors. The transactors are for generating and checking data within said datapath system and are adaptable to arbitrary configurations of the datapath system.

More specifically, in item 102, the method comprises providing a first transactor (REX) for generating raw data on an input side of a first datapath, wherein the first datapath is an egress datapath flowing from inboard inputs of the system to outboard outputs of the system. The first transactor generates raw data based on an embedded algorithm or embedded stimulus. In item 104, a second transactor (EEX) is provided for checking encoded data on an output side of the first datapath. As discussed above, the data flow stages for the second transactor comprise: unmapping serial data, removing protocol, data pattern training, and checking data pattern. Next, in item 106, a third transactor (EIX) is provided for generating encoded data on an input side of a second datapath, wherein the second datapath is an ingress datapath flowing from outboard inputs of the system to inboard outputs of the system. The data flow stages for the third transactor comprise: generating data, inserting protocol, and mapping serial data. In item 108, a fourth transactor (RIX) is provided for checking raw data on an output side of the second datapath. Also as discussed above, the data flow stages for the fourth transactor comprise: handshake logic, data pattern training, and checking data pattern.

The method provides the database with a single set of transactors per core (item 109). By requiring a set of transactors per core rather than per configuration, this reduces the problem of writing testbench transactors from an order $N^2$ problem to an order N problem. As discussed above, this is facilitated by mapping the datapath from one pipeline stage through subsequent pipeline stages to primary input/output ports of the system.

Subsequently, in item 110, the method automatically selects one set of transactors from the database for inclusion into the simulation testbenches. As is consistent with the manner in which transactor requirements were constructed, the set of transactors corresponding to the cores used in the highest protocol layer (i.e. the most inboard pipeline stage) should be selected.

Following selection of a set of transactors, the method maps the first datapath and the second datapath through the datapath system by interconnecting the selected set of transactors with the datapath system (item 120). The mapping comprises mapping the first datapath and the second datapath independently of the data to be generated and checked by the transactors. In addition, the mapping comprises mapping the first datapath and the second datapath with spatial coordinates, which maps the data from inboard datapath pins of the cores to outboard datapath pins of the cores. The first datapath and the second datapath are also mapped with temporal coordinates, which maps the data into one of several clock cycles of the first datapath and the second datapath.

In item 130, the method further comprises setting control pins on the cores to facilitate propagation of the data through the cores of the datapath system. This comprises identifying control signals and control values to be asserted in the simulation testbenches. Next, in item 140, the control pins are traced to an input port or a control register. As discussed above, various control pins are set on the various cores of the system such that the correct modes of operation are selected and the datapath is sensitized.

Accordingly, embodiments of the invention provides a method for generating simulation testbenches for various system configurations given a database containing one set of testbench transactors per supported core (rather than per supported system configuration). By requiring a set of transactors per core rather than per configuration, this reduces the problem of writing testbench transactors from an order $N^2$ problem to an order N problem. This is facilitated by mapping the datapath from one pipeline stage through subsequent pipeline stages to primary input/output ports of the system.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A method for generating a simulation testbench for verifying connections between cores in a specific configuration of a datapath system, said datapath system comprising a plurality of series connected pipeline stages with each pipeline stage implemented by at least one core of a specific type and said method comprising:

for multiple possible configurations of said datapath system, providing a database comprising multiple sets of transactors, each set of said transactors corresponding to a different type of core that could be used to implement one of said pipeline stages and said transactors automatically generating stimulus and checking expected data within said datapath system; and automatically selecting a single one of said multiple sets of said transactors from said database and using said single one of said multiple sets of transactors as a basis for generating said simulation testbench for said specific configuration of said datapath system, said automatically selecting being performed using a computerized device and comprising:

identifying a specific set of transactors that corresponds to a specific type of core that is used to implement a specific pipeline stage that is contained in a highest protocol layer of said specific configuration of said datapath system; and selecting said specific set of transactors.

2. The method according to claim 1, further comprising automatically mapping of a datapath through said specific configuration of said datapath system by interconnecting said specific set of said transactors with said specific configuration of said datapath system, said automatically mapping being performed using a computerized device.

3. The method according to claim 2, said mapping of said datapath comprising mapping said datapath independently of said data to be checked by said transactors.

4. The method according to claim 2, said mapping of said datapath comprising mapping said datapath with spatial coordinates and temporal coordinates, said spatial coordinates mapping said data from inboard datapath pins of said cores to outboard datapath pins of said cores, and said temporal coordinates mapping said data into a clock cycle of said datapath.

5. The method according to claim 1, further comprising setting control pins on said cores to facilitate propagation of said data through said cores of said specific configuration of said datapath system.

6. The method according to claim 5, said setting of said control pins comprising identifying control signals and control values to be asserted in said simulation testbench.

7. The method according to claim 5, further comprising tracing said control pins to input ports and control registers.

8. A method for generating a simulation testbench for verifying connections between cores in a specific configuration of a datapath system, said datapath system comprising a plurality of series connected pipeline stages with each pipeline stage implemented by at least one core of a specific type and said method comprising:

for multiple possible configurations of said datapath system, providing a database comprising multiple sets of transactors, each set of said transactors corresponding to a different type of core that can be used to implement one of said pipeline stages and said transactors automatically generating stimulus and checking expected data within said datapath system;

automatically selecting a single one of said sets of said transactors from said database and using said single one of said sets of transactors as a basis for generating said simulation testbench for said specific configuration of said datapath system, said automatically selecting being performed using a computerized device and comprising:

identifying a specific set of transactors that corresponds to a specific type of core that is used to implement a specific pipeline stage that is contained in a highest protocol layer of said specific configuration of said datapath system; and selecting said specific set of transactors;

automatically mapping a datapath through said specific configuration of said datapath system by interconnecting said specific set of said transactors with said specific configuration of said datapath system, said automatically mapping being performed using said computerized device and comprising: mapping said datapath independently of said data to be checked by said transactors; and setting control pins on said cores to facilitate propagation of said data through said cores of said specific configuration of said datapath system.

9. The method according to claim 8, said mapping of said datapath comprising mapping said datapath with spatial coordinates and temporal coordinates, said spatial coordinates mapping said data from inboard datapath pins of said cores to outboard datapath pins of said cores, and said temporal coordinates mapping said data into a clock cycle of said datapath.

10. The method according to claim 8, said setting of said control pins comprising identifying control signals and control values to be asserted in said simulation testbench.

11. The method according to claim 8, further comprising tracing said control pins to input ports and control registers.

12. A method for generating a simulation testbench for verifying connections between cores in a specific configuration of a datapath system, said datapath system comprising a plurality of series connected pipeline stages with each pipeline stage implemented by at least one core of a specific type and said method comprising:

for multiple possible configurations of said datapath system, providing a database comprising multiple sets of transactors, each set of said transactors corresponding to a different type of core that could be used to implement one of said pipeline said transactors automatically generating stimulus and checking expected data within said datapath system; and automatically selecting a single one of said multiple sets of said transactors from said database and using said single one of said multiple sets of transactors as a basis for generating said simulation testbench for said specific configuration of said datapath system, said automatically selecting being performed using a computerized device and said comprising:

identifying a specific set of transactors that corresponds to a specific type of core that is used to implement a specific pipeline stage that is contained in a highest protocol layer of said specific configuration of said datapath system; and selecting said specific set of transactors;

automatically mapping a datapath through said specific configuration of said datapath system by interconnecting said specific set of said transactors with said specific configuration of said datapath system, said automatically mapping being performed using a computerized device and comprising mapping said datapath independently of said data to be checked by said transactors.

13. The method according to claim 12, said mapping of said datapath comprising mapping said datapath with spatial coordinates and temporal coordinates, said spatial coordinates mapping said data from inboard datapath pins of said cores to outboard datapath pins of said cores, and said temporal coordinates mapping said data into a clock cycle of said datapath.

14. The method according to claim 12, further comprising setting control pins on said cores to facilitate propagation of said data through said cores of said specific configuration of said datapath system.

15. The method according to claim 14, said setting of said control pins comprising identifying control signals and control values to be asserted in said simulation testbenches.

16. The method according to claim 14, further comprising tracing said control pins to input ports and control registers.

* * * * *